(12) United States Patent
Delmot et al.

(10) Patent No.: US 6,885,251 B2
(45) Date of Patent: Apr. 26, 2005

(54) LOW SPURIOUS CHARGE PUMP

(75) Inventors: Thierry Delmot, Brussels (BE); Frans Theresia Jozef Bonjean, Hove (BE)

(73) Assignee: Alcatel, Paris (FR)

( * ) Notice: Subject to any disclaimer, the term of this patent is extended or adjusted under 35 U.S.C. 154(b) by 9 days.

(21) Appl. No.: 10/058,804

(22) Filed: Jan. 30, 2002

(65) Prior Publication Data

US 2002/0105388 A1 Aug. 8, 2002

(30) Foreign Application Priority Data

Feb. 20, 2001 (EP) .............................. 01400276

(51) Int. Cl.[7] .............................................. H03L 7/00
(52) U.S. Cl. ............................ 331/16; 331/8; 327/111; 327/112; 327/382; 327/157
(58) Field of Search ................. 327/382, 157, 327/111, 112; 331/16, 8, 17

(56) References Cited

U.S. PATENT DOCUMENTS 5,825,640 A * 10/1998 Quigley et al. .............. 363/60
6,052,015 A * 4/2000 Desbonnets ................ 327/382
6,160,432 A * 12/2000 Rhee et al. ................. 327/157
6,320,435 B1 * 11/2001 Tanimoto .................... 327/156
6,415,007 B1 * 7/2002 Kawasumi .................. 375/374

OTHER PUBLICATIONS

Patent Abstracts of Japan, May 31, 1999, vol. 1999, No 05 & JP 11 046138 A (Sharp Corp), Feb. 16, 1999.
Patent Abstracts of Japan, Jul. 31, 1997, vol. 1997, No. 07, & JP 09 074739 A (NEC Corp.), Mar. 18, 1997.
Lin Li, et al., "A 1.4GHz Differential Low-Noise CMOS Frequency Synthesizer Using a Wideband PLL Architecture", 2000 IEEE International Solid State Circuits Conference, 2000.

* cited by examiner

*Primary Examiner*—Arnold Kinkead
(74) *Attorney, Agent, or Firm*—Sughrue Mion, PLLC

(57) ABSTRACT

Phase locked loop charge pump comprising a drain node (A, B) and at least a cascode transistor (M4, M6) for limiting the variation of the voltage of said drain node, characterized in that an intermediate switch transistor (M3, M5) is placed between the drain node (A, B) and the cascode transistor (M4, M6).

11 Claims, 1 Drawing Sheet

LOW SPURIOUS CHARGE PUMP

BACKGROUND OF THE INVENTION

The present invention relates to a low spurious charge pump for low phase noise phase locked loops (PLL). Such a charge pump can be used in analog PLL design, solid state circuits, ASIC, integrated circuits, etc.

IEEE paper "A 1.4 gHz Differential Low noise CMOS Frequency Synthesiser using a wideband PLL architecture" from the authors Li Lin et al. published at the 2000 IEEE International Solid State Circuits conference describes PLL charge pumps which are built around a simple cascoded current source. Such a PLL charge pump is schematically shown in appended FIG. 1. Any variation of the voltage of the drain node A1 or B1 of the current source transistor M10 or M20 due to a variation of the output voltage is limited by the cascode transistor M40 or M60. A switch transistor M30, M50 placed in parallel with a cascode transistor, respectively M40, M60 is deviating or not the current pumped by M10 or injected by M20 according to the control signal.

This method allows to control that the current of M10 or M20 is well pumped from or injected to the output node or not. Despite the presence of the cascode transistors M40, M60, this pumping or injection of will induce a change on the voltage on the node A1 or B1. This will generate some voltage transients on the node and consequently spurious on the output current.

SUMMARY OF THE INVENTION

The low spurious charge pump is a pump of a specific structure for reducing current spurious on the output node.

The phase locked loop charge pump of the invention is a pump comprising a drain node and at least a cascode transistor for limiting the variation of the voltage of said drain node, said charge pump being characterised in that an intermediate switch transistor is placed between the drain node and the cascode transistor.

Advantageously, the charge pump comprises a first node, a second node, a branch connecting the first node with the second node, said branch comprising a first cascode transistor and a second cascode transistor, a first switch transistor placed in parallel to the first cascode transistor, and a second switch transistor placed in parallel to the second cascode transistor. At least an intermediate switch transistor is placed between the drain node and a cascode transistor, in parallel to the first switch transistor or to the second switch transistor.

The presence of the said intermediate switch transistors and the said switch transistors placed in parallel with the cascode transistor (main switch transistors) advantageously lowers the spurious on the output current at the transition of the control signal. The intermediate switches and the main switches are advantageously controlled in a complementary way, so that the charges released by the switches opened at one transition of the control signal are pumped by the corresponding complementary switches at the same time.

Preferably, the charge pump comprises two intermediate switch transistors, a first intermediate transistor being placed between the first node and the first cascode transistor, said first intermediate transistor being placed in parallel to the first switch transistor, while the second intermediate switch transistor being placed between the second node and the second cascode transistor, said second intermediate transistor being placed in parallel to the second switch transistor.

According to an embodiment, the first switch transistor in parallel to the first cascode transistor and/or the second switch transistor in parallel to the second cascode transistor is connected to a further cascode transistor in parallel to the first and/or second cascode transistor.

Preferably, the first switch transistor (in parallel to the first cascode transistor) and a further cascode transistor form a dummy branch in parallel to the first cascode transistor and the first intermediate (switch) transistor, said dummy branch having connections so as to be controlled by the complement signal of the signal controlling the first intermediate switch transistor and/or the second switch transistor (in parallel to the second cascode transistor) and a further cascode transistor form a dummy branch in parallel to the second cascode transistor and the second intermediate transistor, said dummy branch having connections so as to be controlled by the complement signal of the signal controlling the second intermediate switch transistor.

The invention relates also to electronic and/or integrated circuits comprising a charge pump according to the invention. For example, the invention relates to a current source elementary cell. The charge pump of the invention can be realised on a support, such as a silicon support, a silicon surface, etc.

BRIEF DESCRIPTION OF THE DRAWINGS

Details and characteristics of the invention will appear from the following description in which reference is made to the attached drawings, wherein.

DETAILED DESCRIPTION OF THE INVENTION

Figure 2:
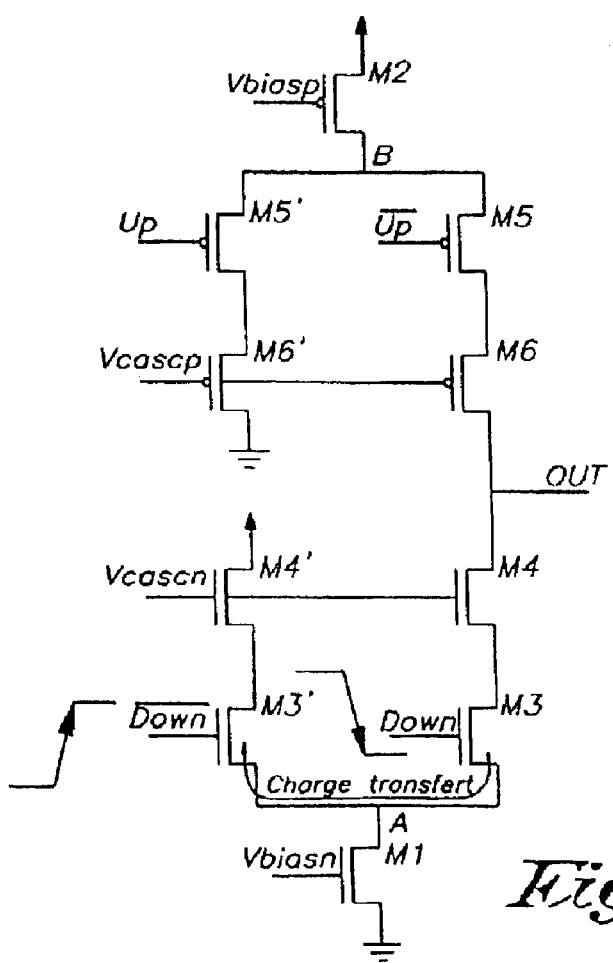
FIG. 2 is a schematic view of a PLL charge pump of the invention.

The charge pump elementary current source cell of FIG. 2, shown as example only, has a specific structure that reduces the artifacts of the charge injections and clock feedthrough. This improves the phase noise of the phase locked loop (PLL) where this charge pump structure is used. Simulations and measurements demonstrate the effective benefit of this structure.

The charge injection and the clock feedthrough are effectively reduced by the use of a specific switched cascode structure shown in FIG. 2.

The cell of FIG. 2 comprises:

a drain node A with a current source transistor M1, a drain node B with a current source transistor M2, a branch connecting the node A to the node B, said branch comprising a first cascode transistor M4 and a second cascode transistor M6, a first intermediate switch transistor M3 being placed between the cascode transistor M4 and the current source transistor M1, while a second intermediate switch transistor M5 is placed between the current source transistor M2 and the cascode transistor M6, a first dummy branch parallel to the first cascode transistor M4 and the first intermediate transistor M3, said dummy branch having a dummy cascode transistor M4' and a dummy switch transistor M3', said carefully matched dummy output branch being controlled by the complement of the down control signal on the transistor M3, a second dummy branch parallel to the second cascode transistor M6 and the second intermediate transistor M5, said dummy branch having a dummy cascode transistor M6' and a dummy switch transistor M5', said carefully matched dummy output branch being controlled by the complement of the up control signal on the transistor M5.

By using this structure, it is possible to make the bias conditions of the current source independent from the control signals (UP and DOWN), which avoids any problem of recovery time.

Moreover, the dummy switch M3' pumps the charges released by the main switch (intermediate switch) M3 at the transition of the control signal. This lowers the amount of charges injected into the output node, as the dummy switch reduces the impedance of the current source drain node A relatively to the cascode transistor source M4 for the time of the control signal transition.

Dummy cascode transistor M4' avoids that the voltage of the node A is varying when the control signal is changing the path of the current pumped by the current source transistor M1. When the control signal DOWN is low, the current pumped by the current source M1 is deviated from the dummy branch. In this configuration, the cascode transistor M4' is taking over the voltage drop between the power supply node and the dummy switch M3'. When the control signal DOWN is high, the current pumped by the current source M1 is deviated from the output. The cascode transistor M4 is then taking over the voltage drop between the output node and the switch transistor M3. By symmetry between the dummy branch M3', M4' and the output branch M3, M4, the voltage drop on the cascode transistors M4 and M4' is such that the potential of the node A is not changing at any time. Consequently, the bias condition of the current source M1 is not depending on the control signal. This avoid variation and spurious on the current pumped by M1.

The dummy switch M5' releases charges which are pumped by the main transistor (intermediate switch transistor) M5 at the transition of the control signal. Said dummy switch M5' reduces also the impedance of the current source drain node B relatively to the cascode transistor source M6 for the time of the control signal transition.

Dummy cascode transistor M6' avoids that the voltage of the node B is varying when the control signal is changing the path of the current injected by the current source transistor M2. When the control signal UP is low, the current injected by the current source M2 is flowing to the dummy branch. In this configuration, the cascode transistor M6' is taking over the voltage drop between the dummy switch M5' and the ground. When the control signal UP is high, the current injected by the current source M2 is deviated from the output. The cascode transistor M6 is then taking over the voltage drop between the switch transistor M5 and the output node. By symmetry between the dummy branch M5', M6' and the output branch M5, M6, the voltage drop on the cascode transistors M6 and M6' is such that the potential of the node B is not changing at any time. Consequently, the bias condition of the current source M2 is not depending on the control signal. This avoid variation and spurious on the current pumped by M2.

Figure 1:
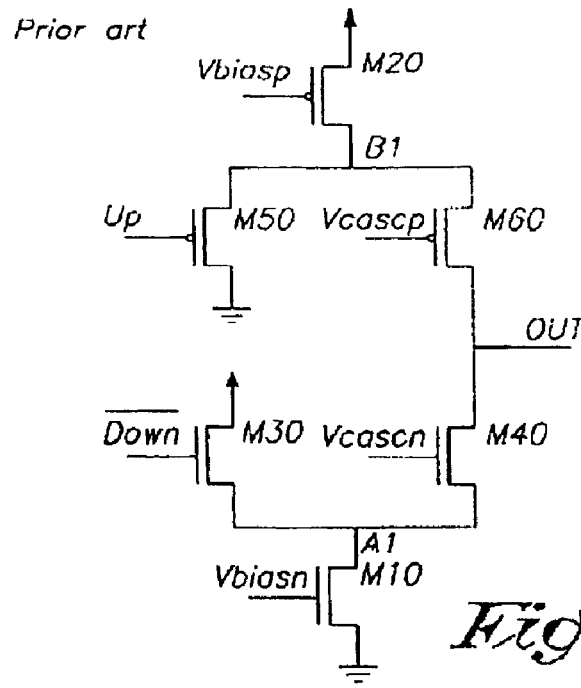
FIG. 1 is a schematic view of a known PLL charge pump.

Main advantages of the use of dummy branches and the use of (intermediate) switch transistors inside the cascode structure of FIG. 2 are:

better control of the charge injections;
no channel recovery problem;
improved phase noise (far less phase noise on the PLL);
keep current constant;
emulate load;
look for symmetry on the circuit and a better control of the impedance at the critical nodes;
Said advantages are obtained with a power-consumption equal or higher than that of the PLL of FIG. 1.

What is claimed is:

1. Phase locked loop charge pump comprising:
   a drain node; and
   at least a cascode transistor for limiting the variation of the voltage of said drain node,
   wherein an intermediate switch transistor is between the drain node and the cascode transistor;
   wherein said drain node is a first node and said cascode transistor is a first cascode transistor;
   wherein said charge pump further comprises:
   a second node, and
   a branch connecting the first node with the second node, said branch comprising the first cascode transistor and a second cascode transistor;
   wherein a first switch transistor is coupled across from the first cascode transistor, and a second switch transistor is coupled across from the second cascode transistor; and
   wherein the intermediate switch transistor is between one of the first node and the second node, and one of the first cascode transistor and the second cascode transistor, and is coupled across from one of the first switch transistor and the second switch transistor.

2. The charge pump of claim 1, wherein said intermediate switch transistor is a first intermediate switch transistor, and said charge pump further comprises a second intermediate switch transistor, wherein the first intermediate switch transistor is between the first node and the first cascode transistor, said first intermediate switch transistor being coupled across from the first switch transistor, and wherein the second intermediate switch transistor being between the second node and the second cascode transistor, said second intermediate transistor being coupled across from the second switch transistor.

3. The charge pump of claim 2, wherein the first switch transistor coupled across from the first cascode transistor and/or the second switch transistor coupled across from the second cascode transistor is connected to a further cascode transistor coupled across from at least one of the first and the second cascode transistor.

4. The charge pump of claim 3, wherein the further cascode transistor is a first additional cascode transistor and wherein the first switch transistor coupled across from the first cascode transistor and the first additional cascode transistor form a dummy branch coupled across from the first cascode transistor and the first intermediate switch transistor, said dummy branch having connections so as to be controlled by the complement signal of the signal controlling at least one of the first intermediate transistor and the second switch transistor coupled across from the second cascode transistor, and wherein a second additional cascode transistor form the dummy branch coupled across from the second cascode transistor and the second intermediate transistor, said dummy branch having connections so as to be controlled by the complement signal of the signal controlling the second intermediate switch transistor.

5. An electronic circuit comprising a charge pump according to claim 1.

6. An integrated circuit comprising a charge pump according to claim 1.

7. A phase locked loop charge pump comprising:

a drain node;

a first cascode transistor to limit the variation of the voltage of said drain node;

a first intermediate switch transistor positioned between said drain node and said first cascode transistor; and a dummy branch with a second cascode transistor connected to a second intermediate switch transistor, wherein said second intermediate switch transistor is positioned between said drain node and said second cascode transistor.

8. The charge pump of claim 1, wherein said drain node is a first node and said cascode transistor is a first cascode transistor, said charge pump further comprises:

a second node; a branch connecting the first node with the second node, wherein the branch comprises the first cascode transistor and a second cascode transistor, a first switch transistor across from the first cascode transistor, and a second switch transistor across from the second cascode transistor, and wherein the intermediate switch transistor is between one of the first node and the second node, and one of the first cascode transistor and the second cascode transistor, and the intermediate switch transistor is across from one of the first switch transistor and the second switch transistor.

9. The charge pump of claim 8, wherein said intermediate switch transistor is a first intermediate switch transistor, and said charge pump further comprises:

a second intermediate switch transistor, wherein the first intermediate switch transistor is between the first node and the first cascode transistor, and is across from the first switch transistor, and wherein the second intermediate switch transistor is between the second node and the second cascode transistor and is across from the second switch transistor.

10. The charge pump of claim 9, wherein at least one of the first switch transistor is across from the first cascode transistor and the second switch transistor is across from the second cascode transistor, and wherein at least one of the first switch transistor and the second switch transistor, is connected to a further cascode transistor across from at least one of the first and the second cascode transistor.

11. The charge pump of claim 10, wherein the further cascode transistor is a first additional cascode transistor, and wherein the first switch transistor across from the first cascode transistor and the first additional cascode transistor form a dummy branch, the dummy branch is across from the first cascode transistor and the first intermediate transistor, and the dummy branch has connections so as to be controlled by the complement signal of the signal controlling at least one of the first intermediate transistor and the second switch transistor across from the second cascode transistor, and wherein a second additional cascode transistor form the dummy branch, the dummy branch is across from the second cascode transistor and the second intermediate transistor, said dummy branch has connections so as to be controlled by the complement signal of the signal controlling the second intermediate switch transistor.

* * * * *